(12) United States Patent
Lin

(10) Patent No.: US 7,002,165 B2
(45) Date of Patent: Feb. 21, 2006

(54) APPARATUS AND METHOD FOR REPAIRING RESIST LATENT IMAGES

(75) Inventor: Burn J. Lin, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 11/119,061

(22) Filed: Apr. 28, 2005

(65) Prior Publication Data

US 2005/0189499 A1 Sep. 1, 2005

Related U.S. Application Data

(62) Division of application No. 10/041,270, filed on Jan. 7, 2002, now Pat. No. 6,897,455.

(51) Int. Cl.
*H01J 37/317* (2006.01)
(52) U.S. Cl. ............................ 250/492.2; 250/491.1; 430/315; 430/396; 430/311; 430/30

(58) Field of Classification Search .................... None
See application file for complete search history.

(56) References Cited

U.S. PATENT DOCUMENTS

| | | |
|---|---|---|
| 5,504,339 A | 4/1996 | Masuda |
| 5,725,995 A | 3/1998 | Leedy |
| 6,703,626 B1 | 3/2004 | Takaoka et al. |

*Primary Examiner*—John R. Lee
*Assistant Examiner*—Zia R. Hashmi
(74) *Attorney, Agent, or Firm*—Tung & Associates

(57) ABSTRACT

A method and an apparatus for repairing resist latent image on a wafer are disclosed. In the method, an image scanner equipped with a first and a second wafer carrier, and a primary imaging column and a secondary imaging column is utilized to conduct the processes of imaging a resist latent image on a first wafer and repairing a defect in a resist latent image on a second wafer positioned on a second wafer carrier simultaneously. The primary imaging column and the secondary imaging column may be situated in the same vacuum chamber to facilitate operation.

11 Claims, 3 Drawing Sheets

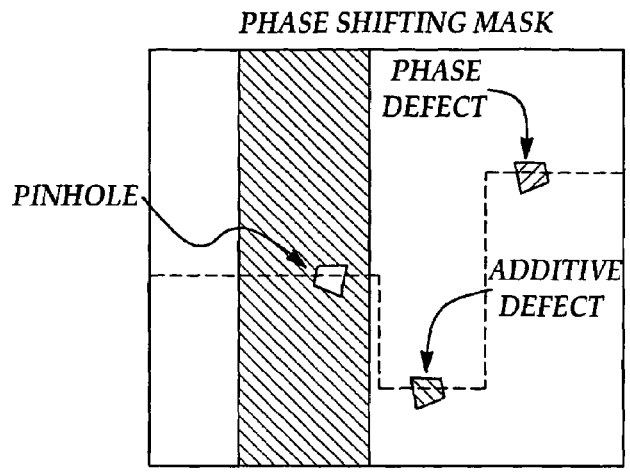
*Figure 3A Prior Art*
*Figure 3B Prior Art*     *Figure 3C Prior Art*
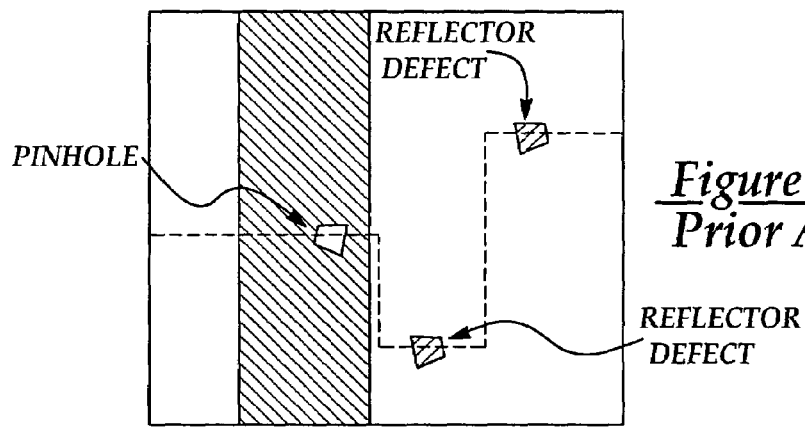
*Figure 4A Prior Art*
*Figure 4B Prior Art*     *Figure 4C Prior Art*

APPARATUS AND METHOD FOR REPAIRING RESIST LATENT IMAGES

This is a divisional of application Ser. No. 10/041,270 filed on Jan. 7, 2002, now U.S. Pat. No. 6,897,455.

FIELD OF THE INVENTION

The present invention generally relates to an apparatus and a method for repairing resist images on a semiconductor wafer and more particularly, relates to an apparatus and a method for repairing resist latent images on a semiconductor wafer in an aligner/scanner equipped with a supplemental imaging column.

BACKGROUND OF THE INVENTION

In microelectronics photolithography, photomasks are employed to replicate by exposing a pattern on a semiconductor wafer. When the microelectronics fabrication processes progressing into the sub-half-micron scales, the demand of higher performance photolithographic techniques has been increased. A recent trend in microelectronics photolithography has been the use of electromagnetic energies with extremely short wavelengths, or instance, in the UV wavelengths, in the X-rays, etc.

In microelectronics photolithography for replicating patterns, it may be necessary to repair the photomask since the mask fabrication process cannot produce defect-free masks at high yield. On binary intensity masks (BIM), there are two types of repair, i.e. filling pinhole defects shown in FIGS. 1A and 1B, and removing opaque defects shown in FIGS. 2A and 2B.

More recently, the technique of phase-shifting mask has been developed to improve the resolution of optical imaging systems. FIGS. 3A, 3B and 3C illustrate problems and results in repairing phase-shifting masks (PSM), wherein phase errors in critical areas have to be repaired in addition to the intensity defects. It is difficult to add or to remove phase shifting materials precisely in depth or refractive index to restore the desired phase relationship.

In another recently developed photolithography technology of extreme UV (EUV) lithography, the mask repair task is even more difficult. This is shown in FIGS. 4A, 4B and 4C. Since the EUV masks are reflective in nature, the mask blank is coated with more than 40 pairs of interference thin film materials to make it reflective. An absorber layer is coated on top of the multi-layer to be selectively removed according to the desired pattern on the mask. Even though repair of the absorber is similar to repairing the absorber pattern in a transmissive BIM, repairing any defect on the multi-layer reflecting areas is extremely difficult. Presently, there is no known method for adding or removing all the layers to the thickness specification, let alone the difficulty of making the repair seamless.

U.S. Pat. No. 6,031,598 to Tichenor et al, discloses an EUV replication system which includes a light source means, a condenser means, a mask means, an imaging lens means, and wafer means as shown in FIG. 3. However, Tichenor et al does not disclose any provision for repairing of the resist latent image itself.

U.S. Pat. No. 5,978,441 to Early, discloses an EUV mask making method by depositing multiple layers on the mask blanket. However, Early does not disclose any method for repairing a mask substrate.

U.S. Pat. No. 5,935,737 to Yan, discloses an EUV mask repair on a mask substrate but not on the resist latent image.

It is therefore an object of the present invention to provide a method for repairing resist latent image on a wafer that does not have the drawbacks or shortcomings of the conventional method .

It is another object of the present invention to provide a method for repairing resist latent image on a wafer in an image scanner that is equipped with a primary imaging column and a supplemental imaging column.

It is a further object of the present invention to provide a method for repairing resist latent image on a wafer wherein the exposure on a first wafer and the repair on a second wafer can be conducted simultaneously in the same vacuum chamber.

It is another further object of the present invention to provide a method for repairing resist latent image on a wafer by utilizing a primary imaging column of EUV imaging optics and a supplemental imaging column of E-beam imaging optics that operate in the same vacuum chamber.

It is still another object of the present invention to provide a method for repairing resist latent image by irradiating an energy beam on a resist defect wherein the energy beam may be an E-beam, an ion-beam or an optical beam.

It is yet another object of the present invention to provide an apparatus for repairing a resist latent image on a wafer which incorporates a primary imaging column and a secondary imaging column.

It is still another further object of the present invention to provide an apparatus for repairing a resist latent image on a wafer which incorporates a primary imaging column and a secondary imaging column that operates in the same vacuum chamber.

It is yet another further object of the present invention to provide an apparatus for repairing a resist latent image on a wafer incorporating a first wafer chucking means and a second wafer chucking means capable of moving the wafer in an X-Y direction.

SUMMARY OF THE INVENTION

In accordance with the present invention, an apparatus and a method for repairing resist latent image on a wafer are provided.

In a preferred embodiment, a method for repairing resist latent image on a wafer can be carried out by the operating steps of providing an image scanner equipped with a first and a second wafer carrier; positioning a wafer on the first wafer carrier situated under a primary imaging column; imaging a resist latent image on the wafer after measuring alignment and focus on the wafer; storing a predetermined defect location in a process controller; moving the wafer positioned on the first wafer carrier under a supplemental imaging column; and irradiating an energy beam on the defect and repairing the resist latent image in a supplemental exposure step.

The method for repairing resist latent image on a wafer may further include the step of moving the second wafer carrier with the wafer on top; irradiate with the energy beam at the preferred location, or the step of monitoring the position of the second wafer carrier by the process controller and laser interferometers.

The method may further include the step of shaping the energy beam to facilitate defect repair. The method may further include the step of irradiating an electron beam on the defect, or the step of irradiating an electron beam and shaping the beam to adjust the size of the beam for said defect, or the step of selecting the energy beam from the group consisting of UV light, X-ray, electron beam and ion-beam. The method may further include the step of irradiating the energy beam of UV light that has a wavelength between about 0.1 nm and about 450 nm. The image scanner may further include an extreme UV imaging column and an E-beam imaging column situated in the same vacuum chamber. The method may further include the step of irradiating the energy beam from a source selected from the group consisting of an E-beam imaging column, an ion-beam imaging column and an optical beam imaging column.

The present invention is further directed to an apparatus for repairing a resist latent image on a wafer that incorporates a primary imaging column and a secondary imaging column which includes a vacuum chamber; a first wafer chucking means capable of moving in an x-y direction for holding a wafer thereon; a primary imaging column situated in the vacuum chamber for imaging a mask pattern on the wafer; a second wafer chucking means for moving the wafer in an x-y direction; and a second imaging column situated in the vacuum chamber for irradiating an energy beam on a defect on the wafer and repairing the mask pattern.

The apparatus for repairing a resist latent image on a wafer may further include a process controller for storing a predetermined defect location in the mask pattern on the wafer. Both wafer chucking means may further include laser interferometers for monitoring its position. The secondary imaging column may be adapted for shaping an energy beam to facilitate defect repair, or the secondary imaging column may be selected from the group consisting of an E-beam imaging column, ion-beam imaging column and optical beam imaging column. The energy beam irradiated may be selected from the group consisting of UV light, X-ray, electron beam and ion-beam. The primary imaging column may be an extreme UV imaging column and the secondary imaging column may be an E-beam imaging column. The primary imaging column may further include an energy source means, a condenser means, a mask means and an imaging lens means. The primary imaging column may further include UV light source means which has a wavelength range between about 0.1 nm and about 450 nm. The primary imaging column may be selected from the group consisting of an E-beam imaging column, an ion-beam imaging column and an optical beam imaging column. The secondary imaging column may further include a spot shaping means, a sizing means and an imaging means.

BRIEF DESCRIPTION OF THE DRAWINGS

These and other objects, features and advantages of the present invention will become apparent from the following detailed description and the appended drawings in which:

FIGS. 3A, 3B and 3C are graphs illustrating a conventional method and result for repairing a phase shifting mask.

FIGS. 4A, 4B and 4C are graphs illustrating a conventional method and result for repairing an extreme UV mask.

DETAILED DESCRIPTION OF THE PREFERRED EMBODIMENT

Figure 1A:
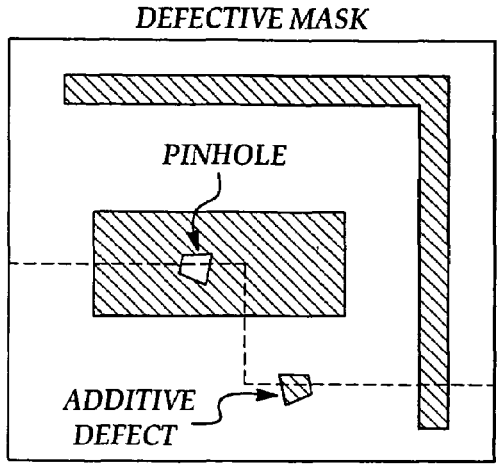
FIGS. 1A and 1B are graphs illustrating a conventional method for filling pinhole defects on a binary intensity mask.
Figure 1B:
Figure 2A:
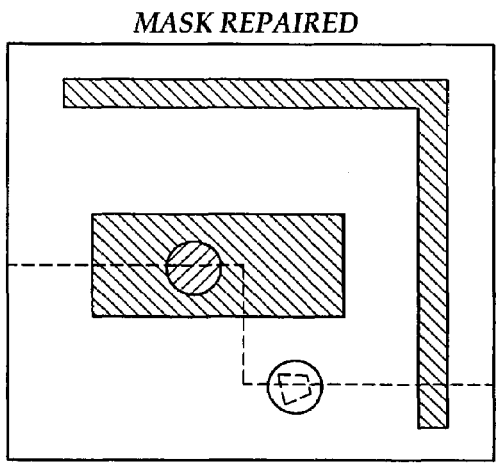
FIGS. 2A and 2B are graphs illustrating a conventional method for removing opaque defects on a binary intensity mask.
Figure 2B:
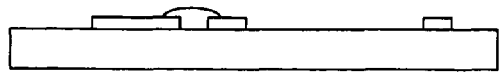

The present invention discloses a method for repairing resist latent image on a wafer by utilizing a primary imaging column and a secondary imaging column positioned in the same vacuum chamber, wherein the primary imaging column is used to image a resist latent image on a wafer, while the secondary imaging column is used to irradiate an energy beam on a defect on the wafer for repairing the resist latent image.

The present invention further discloses an apparatus for repairing a resist latent image on a wafer that incorporates a primary imaging column and a secondary imaging column together with a first wafer chucking means and a second wafer chucking means. The primary imaging column functions to image a mask pattern on the wafer, while the second imaging column irradiates an energy beam on a defect on the wafer to repair the mask pattern.

The invention provides a solution for the mask repair problem in difficult cases of mask repair. Instead of repairing the defect at the mask, the defect is repaired at the resist image. As long as the mask is capable of being imaged to the photoresist, the defect is reproduced in the resist either in the form of additional unwanted resist or missing resist. Before the resist is developed, the defect exhibits itself as an exposed or unexposed latent image. The unexposed resist latent image can be repaired by further exposure to radiation to create an exposed image at the missing part. On the other hand, the exposed resist latent image can sometimes be repaired by further exposure to radiation to cross-link the exposed photoresist material to render it non-developable in order to correct the defect.

The present invention provides a novel apparatus for replicating a mask image and for repairing the subsequent resist latent image. After a mask pattern is written and etched on the substrate, an inspection identifies the type, size and location of the defects and the information is kept in a memory device. All defects from missing absorber are repaired by filling the missing area with the absorber locally. Opaque defects are repaired by removing the opaque spot, wherever feasible. For example, chrome residue can be removed from quartz. However, in a phase shifting mask, if removing the chrome residue can lead to phase shifting damage, then it should not be removed. Defects on the phase shifter should not be removed either. Similarly, with EUV reflective mask, the absorber residue may be removed if the removal process does not reduce the reflectivity of the underlying file stack. Defects in the underlying film stack inevitably leads to low local exposure just as absorber residues, but cannot be repaired at the mask level.

The wafer can be locally exposed at the known locations of the leftover defects not repaired at the mask level, preferably with a spot radiation. The spot radiation is preferably a focused UV light, E-beam, ion-beam or X-ray spot. The spot is preferably adjusted in size and shape to tightly cover the area of the defect. It is preferably slightly larger than the defect to allow for tolerance in placing the focused spot.

When practicing the present invention novel method, in order to maintain the highest positioning accuracy, the wafer is preferably kept on the wafer chuck after the normal patterning exposure without rechucking. Then, the wafer on the wafer chuck is moved to the repair area to be exposed by the radiation spot. Since most mask aligners provide the normal patterning exposure are equipped with laser interferometers to monitor the position of the wafer chuck, positioning the wafers under the radiation spot is relatively easy to accomplish.

Figure 5:
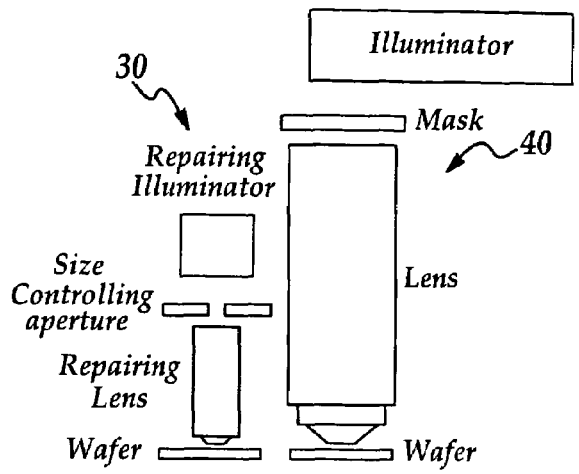
FIG. 5 is a schematic illustrating the present invention apparatus consisting of a primary imaging column and a secondary imaging column.
Figure 6:
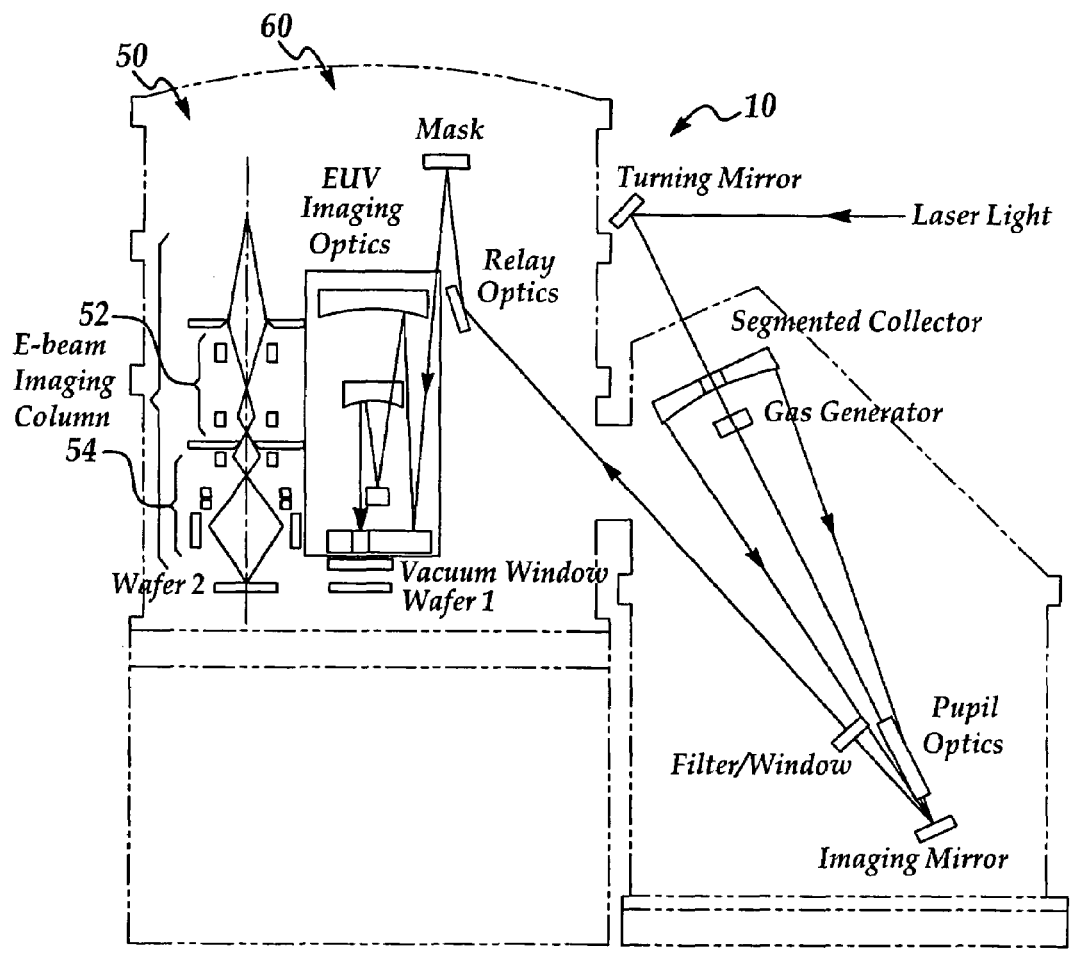
FIG. 6 is a detailed, cross-sectional view illustrating the optical arrangement in the present invention apparatus relevant to EUV imaging.

To improve the throughput, it is preferred to use mask aligners equipped with two wafer chucks as shown in FIGS. 5 and 6. One wafer undergoes normal patterning exposure, while the other wafer is being repaired. The repair operation is preferably combined with operations normally intended for the extra wafer chuck such as measuring the wafer local flatness and the location of alignment marks. Thus, the repair time is absorbed in the time allocated for the operation of the second wafer chuck. Such operation is in parallel to wafer scan and repeat operation.

The present invention radiation spot is created by light source means, condenser means and focusing means. The light source may be a lamp, a laser, an E-beam or ion-beam source, or an X-ray generator. The same light source for the normal patterning exposure can be used, but a separate light source is preferred. This way, an E-beam source may be used to repair EUV defects, while a 193 nm source may be used to repair 13.4 nm replicated defects.

EUV patterning exposure and E-beam spot repair constitute a good combination, since the wafer is operated under vacuum in both types of radiation. One common vacuum source can be used for the patterning exposure and repair to further improve the wafer throughput.

FIG. 5 illustrates a UV repair column 30 that is added to the chamber of the UV imaging column 40. FIG. 6 illustrates an E-beam repairing column 50 that is positioned next to an EUV imaging lens 60 in an EUV scanner or stepper 10. The repairing column includes an illuminator means 52, a size-controlling aperture means 54 and an image lens means 56. The size-controlling aperture means 54 is located at the conjugate plane of the wafer plane through the imaging lens. The size is adjustable by means of movable blades to control the size of the repairing spot. A single light source can be split-off to the regular and the repairing illuminators. Alternately, two separate light sources may be used such that the wavelengths of the two imaging lens may be chosen according to their respective needs. For example, a light source of a different energy may be used to cross-link the repair spot rather than exposing it.

An E-beam repairing column may be used in conjunction with an optical imaging column. Similarly, an optical repairing column may be used with an EUV imaging lens or an E-beam imaging column.

The present invention novel apparatus and method for repairing resist latent images have therefore been amply described in the above description and in the appended drawings of FIGS. 5 and 6.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A method for repairing resist latent image on a wafer comprising the steps of:
    providing an image scanner equipped with a wafer carrier;
    positioning a wafer on said wafer carrier situated under a primary imaging column;
    imaging a resist latent image on said wafer after measuring alignment and focus on said wafer;
    storing a predetermined defect location in a process controller;
    moving said wafer on said wafer carrier to under a supplemental imaging column; and
    irradiating an energy beam on said defect and repairing said resist latent image in a supplemental exposure step.

2. A method for repairing resist latent image on a wafer according to claim 1 further comprising the step of moving said wafer carrier with said wafer on top under said irradiation of said energy beam.

3. A method for repairing resist latent image on a wafer according to claim 2 further comprising the step of monitoring the position of said wafer carrier by said process controller.

4. A method for repairing resist latent image on a wafer according to claim 2 further comprising the step of monitoring the position of said wafer carrier by laser interferometers.

5. A method for repairing resist latent image on a wafer according to claim 1 further comprising the step of shaping said energy beam to facilitate defect repair.

6. A method for repairing resist latent image on a wafer according to claim 1 further comprising the step of irradiating an electron beam on said defect.

7. A method for repairing resist latent image on a wafer according to claim 1 further comprising the step of irradiating an electron beam and shaping said beam to adjust the size of said beam for said defect.

8. A method for repairing resist latent image on a wafer according to claim 1 further comprising the step of selecting said energy beam from the group consisting of UV light, X-ray, electron beam and ion-beam.

9. A method for repairing resist latent image on a wafer according to claim 1 further comprising the step of irradiating said energy beam of UV light having a wavelength between about 0.1 nm and about 450 nm.

10. A method for repairing resist latent image on a wafer according to claim 1, wherein said image scanner comprises an extreme UV imaging column and an E-beam imaging column situated in the same vacuum chamber.

11. A method for repairing resist latent image on a wafer according to claim 1 further comprising the step of irradiating said energy beam from a source selected from the group consisting of an E-beam imaging column, ion-beam imaging column and optical beam imaging column.

* * * * *